United States Patent
Rhodes

(10) Patent No.: US 7,432,543 B2
(45) Date of Patent: Oct. 7, 2008

(54) IMAGE SENSOR PIXEL HAVING PHOTODIODE WITH INDIUM PINNING LAYER

(75) Inventor: Howard E. Rhodes, Boise, ID (US)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 11/004,246

(22) Filed: Dec. 3, 2004

(65) Prior Publication Data

US 2006/0118836 A1 Jun. 8, 2006

(51) Int. Cl.
*H01L 31/062* (2006.01)
*H01L 27/148* (2006.01)

(52) U.S. Cl. .................. 257/292; 257/233; 257/290

(58) Field of Classification Search .......... 257/231, 257/233, 290–292, 461–463, E27.132, E27.133; 438/48
See application file for complete search history.

(56) References Cited

U.S. PATENT DOCUMENTS

| | | | |
|---|---|---|---|
| 6,730,899 B1 * | 5/2004 | Stevens et al. ........... 250/208.1 |
| 7,049,671 B2 * | 5/2006 | Kimura ...................... 257/437 |
| 7,105,906 B1 * | 9/2006 | Hopper et al. ............. 257/440 |
| 2003/0096490 A1 * | 5/2003 | Borland et al. ............. 438/513 |
| 2004/0043529 A1 | 3/2004 | Fossum |
| 2004/0173799 A1 | 9/2004 | Patrick |
| 2004/0188727 A1 | 9/2004 | Patrick |
| 2005/0116270 A1 * | 6/2005 | Roy ........................... 257/292 |

FOREIGN PATENT DOCUMENTS

| | | |
|---|---|---|
| EP | 1 649 685 A | 3/2006 |
| EP | 1 649 517 A | 4/2006 |
| EP | 1 656 699 A | 5/2006 |
| WO | WO 2005/006738 A1 | 1/2005 |
| WO | WO 2005/013370 A1 | 2/2005 |
| WO | WO 2005/022638 A2 | 3/2005 |

OTHER PUBLICATIONS

EP 1667 232 A3, European Search Report, dated May 11, 2007.

* cited by examiner

*Primary Examiner*—Hung Vu
(74) *Attorney, Agent, or Firm*—Blakely Sokoloff Taylor & Zafman LLP

(57) ABSTRACT

An active pixel using a pinned photodiode with a pinning layer formed from indium is disclosed. The pixel comprises a photodiode formed in a semiconductor substrate. The photodiode is an N⁻ region formed within a P-type region. A pinning layer formed from indium is then formed at the surface of the N⁻ region. Further, the pixel includes a transfer transistor formed between the photodiode and a floating node and selectively operative to transfer a signal from the photodiode to the floating node. Finally, the pixel includes an amplification transistor controlled by the floating node.

21 Claims, 4 Drawing Sheets

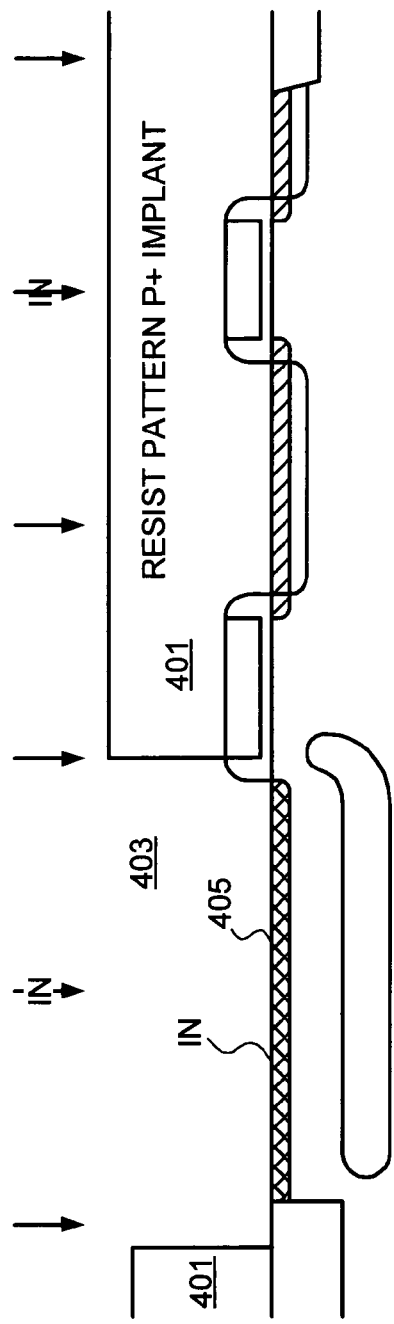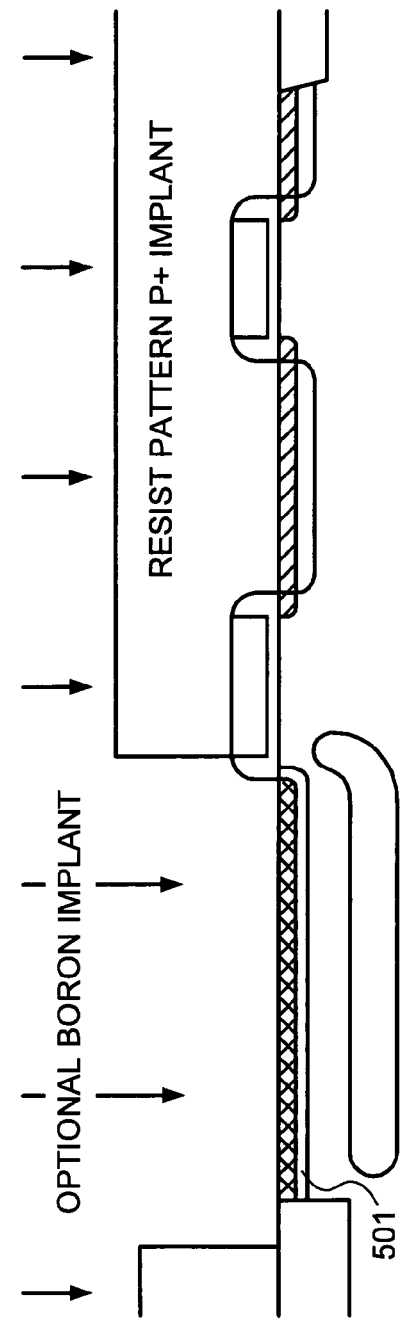

IMAGE SENSOR PIXEL HAVING PHOTODIODE WITH INDIUM PINNING LAYER

TECHNICAL FIELD

The present invention relates to image sensors, and more particularly, to an image sensor that uses pixels with a photodiode having an indium surface dopant that forms a p+ pinning layer.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

As the pixels become smaller, the surface area that can receive incident light is also reduced. The pixel typically has a light-sensing element, such as a photodiode, which receives incident light and produces a signal in relation to the amount of incident light. Thus, as the pixel area (and thus the photodiode area) decreases, the well capacity of the photodiode also becomes smaller.

One prior art structure of a photodiode that has enhanced well capacity comprises a shallow N⁻ layer in a P-type region or substrate. A P⁺ pinning layer is then formed over the shallow N⁻ layer. The P⁺ pinning layer is universally formed by implanting boron, because of boron's relatively good solid solubility.

This structure is known as a pinned photodiode and has relatively high well capacity, but sometimes at the expense of "dark current" performance and excess "hot pixel" defects. Further, because of the statistical nature of dopant implantation, the local concentration of an implanted dopant, such as the dopant for the N⁻ layer, may vary spacially. In some cases, it is probable that a higher than average number of n-type ions are implanted near the silicon surface. This generates a local n-type region that punches into the surface P⁺ pinning region and can result in a local increase in dark current and hot pixel defect density.

BRIEF DESCRIPTION OF THE DRAWINGS

FIGS. 2-6 are cross-sectional diagrams showing a method of making a photodiode and pixel in accordance with the present invention.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
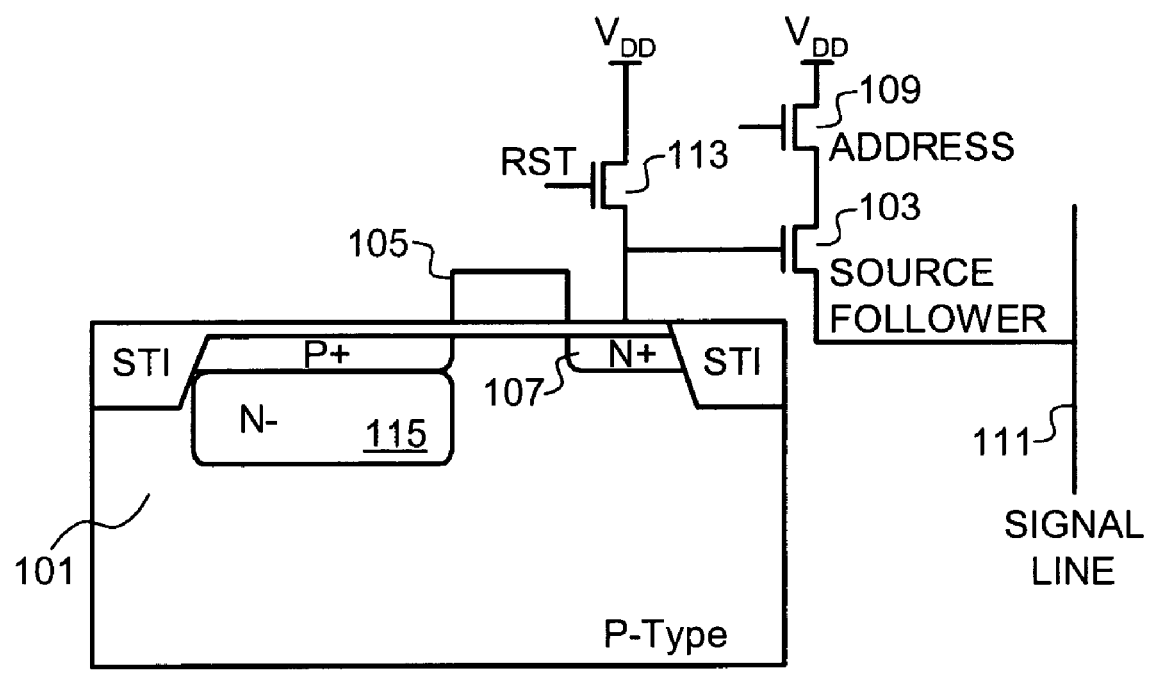
FIG. 1 is a combination cross-sectional and schematic diagram of a prior art four transistor (4T) pixel which shows in detail a photodiode formed in a substrate.

FIG. 1 shows a combination cross-sectional and schematic view of a prior art active pixel that uses four transistors. This is known in the art as a 4T active pixel. However, it can be appreciated that the photodiode design of the present invention can be used with any type of pixel design, including but not limited to 3T, 4T, 5T, 6T, and other designs. Further, the photodiode design of the present invention may also be used in connection with charge coupled device (CCD) imagers.

A photodiode 101, outputs a signal that is used to modulate an amplification transistor 103. The amplification transistor 103 is also referred to as a source follower transistor. In this embodiment, the photodiode 101 can be either a pinned photodiode or a partially pinned photodiode. A transfer transistor 105 is used to transfer the signal output by the photodiode 101 to a floating node 107 (N+doped) and to the gate of the gate of the amplification transistor 103. The transfer transistor 105 is controlled by a transfer gate.

In operation, during an integration period (also referred to as an exposure or accumulation period), the photodiode 101 generates charge (in response to incident light) that is held in the N⁻ layer 115. After the integration period, the transfer transistor 105 is turned on to transfer the charge held in the N⁻ layer 115 of the photodiode 101 to the floating node 107. After the signal has been transferred to the floating node 107, the transfer transistor 105 is turned off again for the start of a subsequent integration period.

The signal on the floating node 107 is then used to modulate the amplification transistor 103. Finally, an address transistor 109 is used as a means to address the pixel and to selectively read out the signal onto a column bitline 111. After readout through the column bitline 111, a reset transistor 113 resets the floating node 107 to a reference voltage. In one embodiment, the reference voltage is $V_{dd}$.

As noted above, electrons are accumulated in the N⁻ layer 115 during the integration period. After the integration period, the electrons (signal) are transferred from the N⁻ layer 115 into the floating node 107 by applying a high voltage pulse to the transfer gate of the transfer transistor 105.

Figure 2:
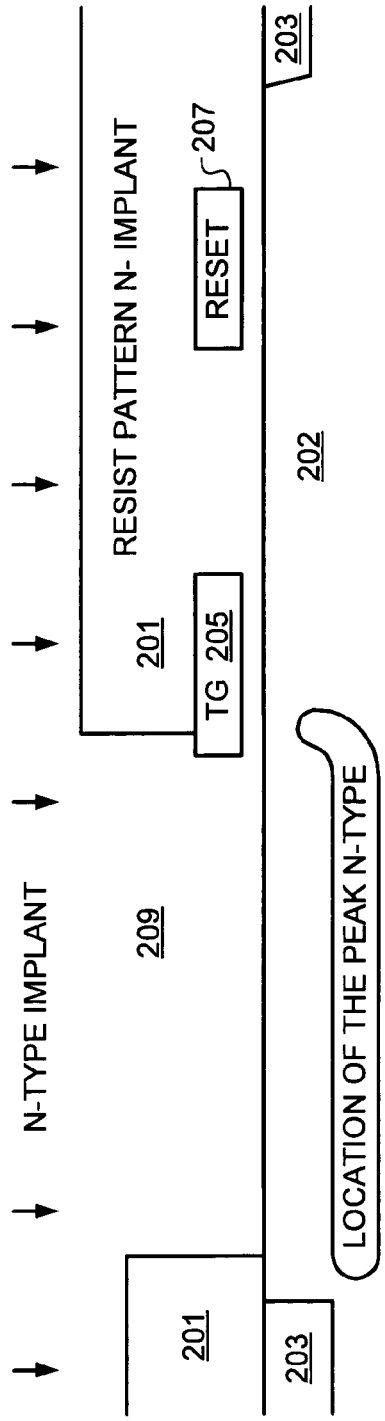

FIGS. 2-6 show a method for forming the photodiode of the present invention as well as the structure of the present photodiode. Specifically, as seen in FIG. 2, a photoresist pattern 201 is formed atop of the semiconductor substrate 202. In this embodiment, the substrate 202 has a transfer gate 205 of a transfer transistor and a reset gate 207 of a reset transistor formed thereon. Also shown are isolation regions 203, in one embodiment shallow trench isolations (STI). The photoresist pattern 201 has an opening 209 to allow an n-type (N⁻) implant to be applied between the STI 203 and the transfer gate 205. The n-type implant is typically arsenic or phosphorus, but can be any n-type dopant.

In one embodiment, an arsenic implant is used having an energy range of 50 keV-300 keV, and more preferably 100 keV-200 keV. Alternatively, a phosphorus implant of 25 keV-150 keV, and more preferably 50 keV-100 keV may be used. However, other implantation energies may be equally suitable.

Figure 3:
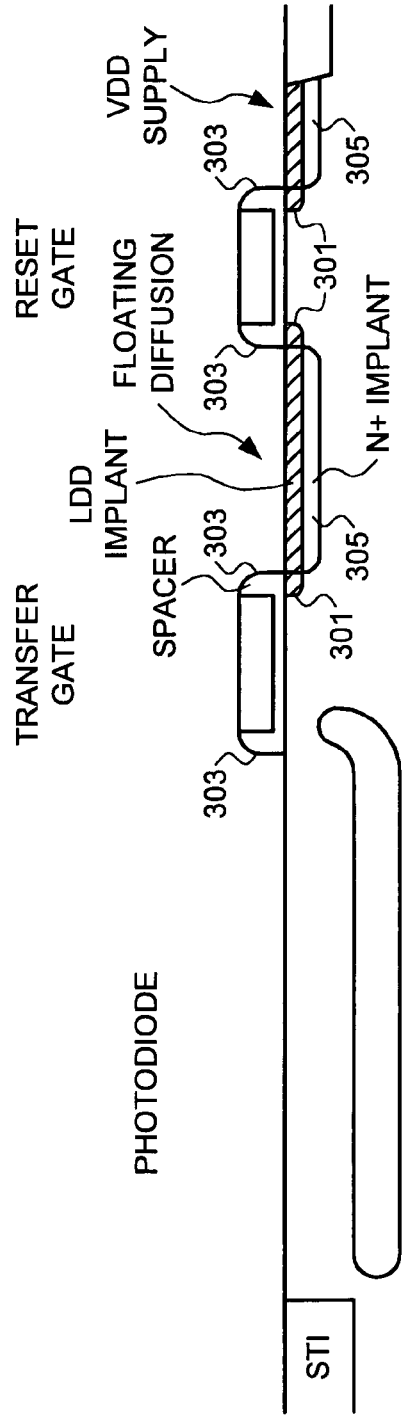

Next, turning to FIG. 3, various conventional steps are performed to form lightly doped drain regions 301 adjacent the transfer gate 205 and reset gate 207. Further, sidewall spacers 303 are formed on the transfer and reset gates and N+ regions 305 are formed between the transfer and reset gates, as well as between the reset gate 207 and the STI 203. These structures, and the steps used to form them, are conventional in the prior art, but are briefly described herein for completeness.

Next, turning to FIG. 4, another photoresist pattern 401 is formed, once again having an opening 403 that exposes the photodiode region. Using the photoresist pattern 401, an indium dopant implant is performed to form a p-type (P+) pinning layer 405. In one embodiment, the indium is implanted using 25 KeV-300 KeV, and preferably between 40 KeV-100 KeV of energy and a dopant concentration of 1 e 13 ions/cm$^2$ to 5e14 ions/cm$^2$, and more preferably 4e13 ions/cm$^2$ to 2e14 ions/cm$^2$. However, it can be appreciated that other energy levels and dopant concentrations may also be used, depending upon specific desired device characteristics and other design considerations.

Turning to FIG. 5, an optional boron implant 501 is performed, still using the photoresist pattern 401 as a mask. The boron implant may be implemented using diborane ($B_2H_6$) or $BF_2$ as the dopant. The optional boron implant is provided to further increase the dosage and/or to create a P+ graded junction for the P+ pinning layer. In one embodiment, the boron is implanted using $BF_2$ at 5 KeV to 100 KeV and preferably 10 KeV to 30 KeV at a dopant concentration of 1e13 ions/cm$^2$ to 5e14 ions/cm$^2$, and preferably at 4e13 ions/cm$^2$ to 2e14 ions/cm$^2$. The use of a boron and indium dual implant grades the surface profile. This allows the creation of a heavily doped region near the surface (comprised of indium), and a lower graded region of boron. The higher indium concentration near the surface blocks the depletion region from extending up to the surface and the surface defects.

Figure 6:
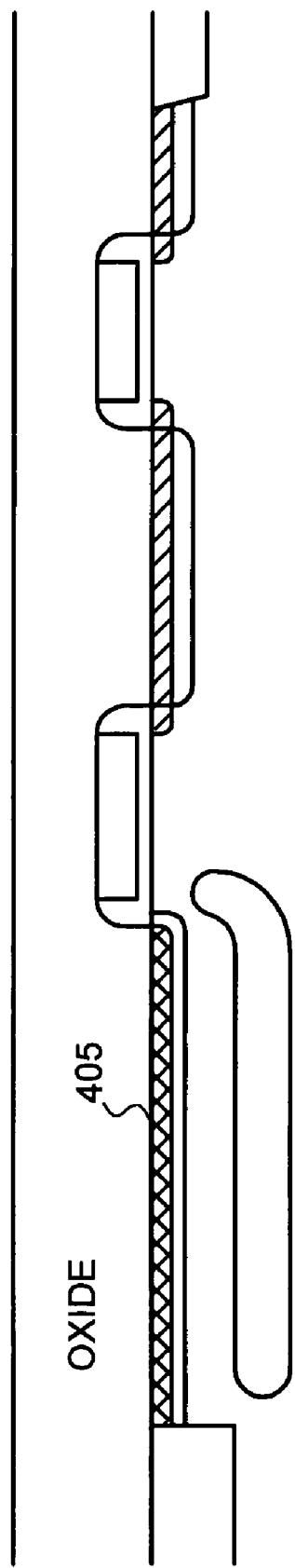

Finally, turning to FIG. 6, an insulator, such as oxide, is formed over the structure. The oxide may then be planarized using various techniques, such as chemical mechanical polishing or etching back. Typically, various thermal processes are performed on the semiconductor wafer in connection with further manufacturing processes, such as the formation of metal interconnects. The thermal processes tend to have a relatively minimal effect on the indium p+ layer 405, since indium has low diffusivity. The result is that the indium p+ layer 405 stays near the surface. In the case of the optional boron implant, the thermal processing results in high diffusivity, which causes the boron dopant to diffuse further.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A pixel comprising:
a photodiode formed in a semiconductor substrate, said photodiode being an N-region formed within a P-type region, further wherein said photodiode has a p+ pinning layer on the surface of said semiconductor substrate and above said N-region, wherein the P+ pinning layer includes a first edge proximate to a shallow trench isolation ("STI") region and a second edge opposite the first edge, said P+ layer including a graded surface profile of indium and boron fluoride ($BF_2$);
a transfer gate formed on the surface of the semiconductor substrate; and
a floating node formed within the semiconductor substrate, wherein the transfer gate is formed between the photodiode and the floating node to selectively transfer a signal from the photodiode to the floating node, wherein there is no pinning layer beneath the transfer gate, and wherein the transfer gate includes a first edge proximate to the floating node and a second edge opposite the first edge of the transfer gate, wherein the second edge of the transfer gate is offset from the second edge of the P+ pinning layer.

2. The pixel of claim 1 wherein said indium is implanted with a dosage of between 1e13 ions/cm$^2$ to 5e14 ions/cm$^2$.

3. The pixel of claim 1 further including: an amplification transistor controlled by said floating node.

4. The pixel of claim 1 further including a reset transistor operative to reset said floating node to a reference voltage.

5. The pixel of claim 1 wherein the pixel is incorporated into a CCD image sensor.

6. The pixel of claim 1 wherein the pixel is incorporated into a CMOS image sensor.

7. The pixel of claim 6 wherein said pixel is a part of a 3T, 4T, 5T, 6T, or 7T architecture.

8. The pixel of claim 1 wherein said boron fluoride ($BF_2$) is implanted with a dosage of 1e13 ions/cm$^2$ to 5e14 ions/cm$^2$.

9. The pixel of claim 1 wherein said graded surface profile of indium and boron fluoride ($BF_2$) has the boron fluoride ($BF_2$) diffused farther into said semiconductor substrate than the indium.

10. The pixel of claim 1 wherein the indium is proximate to a surface of said semiconductor substrate and the boron fluoride ($BF_2$) is diffused farther into said semiconductor substrate than the indium.

11. The pixel of claim 1, further comprising an insulator formed over said photodiode.

12. The pixel of claim 1, wherein the second edge of the transfer gate is above and overlaps a portion of the N-region.

13. The pixel of claim 1, further comprising a sidewall spacer formed on the transfer gate, wherein an edge of the sidewall spacer is substantially collinear with an edge of an indium implant of the P+ pinning layer.

14. The pixel of claim 13, wherein a boron fluoride implant of the P+ pinning layer extends from the STI region to between the edge of the indium implant and the second edge of the transfer gate.

15. A pixel comprising:
a photodiode formed in a semiconductor substrate, said photodiode being an N-region formed within a P-type region, further wherein said photodiode has a P+ pinning layer on the surface of said semiconductor substrate and above said N-region, wherein the P+ pinning layer includes a first edge proximate to a shallow trench isolation ("STI") region and a second edge opposite the first edge, said P+ layer including a graded surface profile of indium and diborane ($B_2H_6$);
a transfer gate formed on the surface of the semiconductor substrate; and
a floating node formed within the semiconductor substrate, wherein the transfer gate is formed between the photodiode and the floating node to selectively transfer a signal from the photodiode to the floating node, wherein there is no pinning layer beneath the transfer gate, and wherein the transfer gate includes a first edge proximate to the floating node and a second edge opposite the first edge of the transfer gate, wherein the second edge of the transfer gate is offset from the second edge of the P+ pinning layer.

16. The pixel of claim 15 further including: an amplification transistor controlled by said floating node.

17. The pixel of claim 15 further including a reset transistor operative to reset said floating node to a reference voltage.

18. The pixel of claim 15 wherein said graded surface profile of indium and diborane ($B_2H_6$) has the diborane ($B_2H_6$) diffused farther into said semiconductor substrate than the indium.

19. The pixel of claim 15 wherein the indium is proximate to a surface of said semiconductor substrate and the diborane ($B_{2H6}$) is diffused farther into said semiconductor substrate than the indium.

20. The pixel of claim 15, wherein the second edge of the transfer gate is above and overlaps a portion of the N-region.

21. The pixel of claim 15, wherein the N-region includes an edge that is disposed below the transfer gate, wherein the second edge of the transfer gate is disposed between the second edge of the P+ pinning layer and the edge of the N-region.

* * * * *

UNITED STATES PATENT AND TRADEMARK OFFICE
CERTIFICATE OF CORRECTION

PATENT NO. : 7,432,543 B2  
APPLICATION NO. : 11/004246  
DATED : October 7, 2008  
INVENTOR(S) : Howard E. Rhodes Page 1 of 1

It is certified that error appears in the above-identified patent and that said Letters Patent is hereby corrected as shown below:

In Claim 19, line 3, please delete "$B_{2H6}$" and insert -- $B_2H_6$ --.

Signed and Sealed this

Thirteenth Day of January, 2009

JON W. DUDAS  
*Director of the United States Patent and Trademark Office*

UNITED STATES PATENT AND TRADEMARK OFFICE
CERTIFICATE OF CORRECTION

PATENT NO.         : 7,432,543 B2 Page 1 of 1
APPLICATION NO. : 11/004246
DATED              : October 7, 2008
INVENTOR(S)     : Howard E. Rhodes It is certified that error appears in the above-identified patent and that said Letters Patent is hereby corrected as shown below:

Column 5, in Claim 19, line 7, please delete "$B_{2H6}$" and insert -- $B_2H_6$ --.

This certificate supersedes the Certificate of Correction issued January 13, 2009.

Signed and Sealed this

Third Day of February, 2009

JOHN DOLL
*Acting Director of the United States Patent and Trademark Office*